(12) United States Patent
Miura et al.

(10) Patent No.: US 6,945,381 B2
(45) Date of Patent: Sep. 20, 2005

(54) CIRCUIT BOARD FIXING TABLE, CIRCUIT BOARD FIXING METHOD AND ELECTRONIC COMPONENT MOUNTING APPARATUS

(75) Inventors: Izumi Miura, Yamanashi (JP);
Hirofumi Obara, Yamanashi (JP);
Naoto Mimura, Yamanashi (JP);
Kazuyuki Nakano, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 579 days.

(21) Appl. No.: 10/016,321

(22) Filed: Dec. 10, 2001

(65) Prior Publication Data
US 2002/0069517 A1 Jun. 13, 2002

(30) Foreign Application Priority Data
Dec. 12, 2000 (JP) .................................. P.2000-377526

(51) Int. Cl.[7] .............................................. B65G 47/24
(52) U.S. Cl. ................ 198/345.1; 198/345.3; 29/740
(58) Field of Search ............ 198/345.1, 345.3, 198/346.3; 29/740, 759, 760

(56) References Cited

U.S. PATENT DOCUMENTS

| | | | | |
|---|---|---|---|---|
| 4,202,092 A | * | 5/1980 | Shibasaki et al. .......... 29/741 |
| 4,681,208 A | * | 7/1987 | Harringer et al. ....... 198/341.05 |
| 5,218,753 A | * | 6/1993 | Suzuki et al. ................ 29/740 |
| 5,282,524 A | * | 2/1994 | Kakida et al. ........... 198/345.1 |
| 5,722,527 A | * | 3/1998 | Van Gastel et al. ...... 198/345.3 |
| 5,974,654 A | | 11/1999 | Morita |
| 5,985,029 A | * | 11/1999 | Purcell .................... 198/345.1 |
| 6,189,674 B1 | * | 2/2001 | Izumida et al. ........ 198/341.01 |
| 6,471,050 B2 | * | 10/2002 | Ikeda et al. ............. 198/345.1 |
| 6,853,874 B2 | * | 2/2005 | Kawada et al. ............. 700/213 |

FOREIGN PATENT DOCUMENTS

| | | |
|---|---|---|
| JP | 60-257200 | 12/1985 |
| JP | 01028900 | 1/1989 |
| JP | 03034400 | 2/1991 |
| JP | 2001138498 | 5/2000 |

* cited by examiner

*Primary Examiner*—James R. Bidwell
(74) *Attorney, Agent, or Firm*—Pearne & Gordon LLP

(57) ABSTRACT

There is provided a circuit board fixing table having a structure in which no vibration or shock is applied to a transport motor when a circuit board is fixed and an electronic component mounting apparatus utilizing the circuit board fixing table and capable of mounting electronic components without causing operational failures during transportation. A circuit board fixing table for transporting a circuit board placed on transport belts to a predetermined position and fixing it with an elevating fixing device, the table having a transport motor provided separately from a support member for the transport belts for driving the transport belts and power transmission mechanisms A and B for transmitting a driving force of the transport motor to the transport belts.

11 Claims, 14 Drawing Sheets

CIRCUIT BOARD FIXING TABLE, CIRCUIT BOARD FIXING METHOD AND ELECTRONIC COMPONENT MOUNTING APPARATUS

FIELD OF THE INVENTION

The present invention relates to a circuit board fixing table for transporting and fixing a circuit board, a circuit board fixing method, and an electronic component mounting apparatus utilizing the same and, more particularly, to a technique for preventing damages and problems of a transport motor.

DESCRIPTION OF THE RELATED ART

For example, some of electronic component mounting apparatuses for mounting electronic components on a circuit board suck electronic components from a component supply section and hold the electronic components by a mounting head including a suction nozzle for sucking components, and then, mount the held electronic components in predetermined positions on the circuit board fixed on a circuit board fixing table. In such electronic component mounting apparatuses, the circuit board is supported by two transport belts at both ends in a direction of a width of the circuit board, is loaded from a loader section, and is fixed on the circuit board fixing table that is located in a mounting position. A backup plate is provided under the circuit board fixing table. The backup plate includes a multiplicity of pin insertion holes drilled in the form of a matrix into which a multiplicity of backup pins are removably inserted. The backup pins inserted in desired pin insertion holes of the backup plate push up a circuit board at upper ends of the backup pin in order to fix the circuit board.

FIG. 14 shows a side view of the conventional circuit board fixing table described above, and illustrates the configuration and the operation of the conventional circuit board fixing table. At first, as shown in FIG. 14(a), a circuit board 12 placed on a transport belt 80 is transported by driving a transport motor 84 provided integrally with a circuit board fixing table 82, and the driving of the transport motor 84 is stopped when the circuit board 12 reaches a predetermined position. At this time, a backup plate 86 is on standby in a standby position under guide rails 88.

Next, as shown in FIG. 14(b), the backup plate 86 is moved upward. Then, the ends of the backup pins abut to the circuit board 21, and a projection 92 projecting from the top surface of the backup plate 86 abuts to an abutting portion 94 on the bottom of the guide rails 88 to cause the guide rails 88 to move upward together with the backup plate 86. Then, as shown in FIG. 14(c), the circuit board 12 thus pushed up is pressed against a board fixing plate 96 fixed above the transport belt 80. The elevation of the backup plate 86 is stopped at the position that the circuit board 12 is pressed against the board fixing plate 96. At this time, the circuit board 12 is thus fixed on the circuit board fixing table 82 in a such situation that the bottom surface of the circuit board is pushed upward by the backup pins 90 and the top surface of the circuit board is pressed by the board fixing plate 96 at both ends of the top of surface of the circuit board in the direction of the width.

SUMMARY OF THE INVENTION

In the above-described conventional circuit board fixing table 82, the transport motor 84 for driving the transport belt 80 is provided integrally with the guide rails 88. Therefore, as apparent from the vertical sections of the circuit board fixing table 82 in the transport direction shown in FIG. 15, when the backup plate 86 moves upward from the standby position shown in FIG. 15(a) to reach the position shown in FIG. 15(b), namely, when the projection 92 of the backup plate 86 abuts to the abutting portion 94 of the guide rails 88, resultant vibration and shock are propagated to the transport motor 84 substantially and directly. The vibration and the shock are propagated to the transport motor also when it stops at the position where it is pressed against the board fixing plate 96 shown in FIG. 15(c). The vibration and shock can damage an encoder, a detection circuit and so on made of a glass base material or the like provided in the transport motor 84, and the vibration and shock has caused a malfunction of the transport motor 84.

The present invention was conceived taking such problems with the prior art into consideration. It is a first object of the present invention to provide a circuit board fixing table that does not apply vibration and shock to a transport motor when fixing a circuit board. Moreover, it is a second object of the present invention to provide an electronic component mounting apparatus capable of mounting electronic components without causing any malfunctions attributable to transportation utilizing such a circuit board fixing table.

In order to achieve the above-described object, a first aspect of the invention is directed to a circuit board fixing table for transporting and fixing a circuit board placed on a transport belt, characterized in that the circuit board fixing table includes a fixing device for fixing the circuit board, a support member of the transport belts, a transport motor provided separately from the support member of the transport belt for driving the transport belt, and a power transmission mechanism for transmitting a driving force of the transport motor to the transport belt.

In this circuit board fixing table, the transport motor for driving the transport belt is provided separately from the supporting member in order to drive the transport belt through a power transmission mechanism. Therefore, neither vibration nor shock is applied to the transport motor when vibration occurs during the elevating operation of the fixing device. Consequently, it is possible to prevent the transport motor being damaged and malfunctioning.

A second aspect of the invention is directed to the circuit board fixing table wherein the power transmission mechanism links the transport motor with the transport belt when the circuit board is transported, and unlink the transport motor with the transport belt when the circuit board is not transported.

In this circuit board fixing table, the transport motor is linked with the transport belts only when a circuit board is transported, and the linkage is canceled when a circuit board is not carried out. This process allows the linkage between the transport motor and the transport belt to be canceled when the driving force for transportation is not required. As a result, the transport belt can move regardless of the position when the transport motor is provided, and flexibility in designing the circuit board fixing table is thus improved.

A third aspect of the invention is directed to the circuit board fixing table further including an elevation actuator, wherein the power transmission mechanism including a driven side power transmission member attached to a driving shaft for the transport belt, and a driving side power transmission member attached to a shaft that is driven by the transport motor for rotation and provided such that it can be linked with the driven side power transmission member, wherein the elevation actuator elevates the driven side power transmission member and the driving side power transmission member relatively so that the driven side power transmission member links and unlinks with the driving side power transmission member.

In this circuit board fixing table, the driven side power transmission member at the transport belt can be linked and unlinked with the driving side power transmission member at the transport motor by elevating the driven side power transmission member and the driving side transmission member relatively with the elevation actuator. This makes it possible to cause the operation of fixing a circuit board and the operation of switching power transmission with a single actuator and to simplify the configuration of the apparatus consequently.

A forth aspect of the invention is directed to the circuit board fixing table, wherein the power transmission mechanism including a driven side power transmission member attached to a driving shaft for the transport belt, and a driving side power transmission member attached to a shaft that is driven by the transport motor for rotation and provided such that it can be linked with the driven side power transmission member, wherein the fixing device elevates the transport belts so that the driven side power transmission member links and unlinks with the driving side power transmission member.

In this circuit board fixing table, the driven side power transmission member at the transport belt can be linked and unlinked with the driving side power transmission member at the transport motor by elevating the transport belts with the fixing device. This makes it possible to cause the operation of fixing a circuit board and the operation of switching power transmission with a single actuator and to simplify the configuration of the apparatus consequently.

A fifth aspect of the invention is directed to the circuit board fixing device, wherein the elevation actuator elevates a backup plate provided under the transport belts, and the backup plate includes a plurality of backup pins and pushes up and fixes the circuit board by the backup pins when the backup plate ascends.

In this circuit board fixing table, the transport belts are unlinked with the transport motor when the backup plate is moved upward, and the transport belts is linked with the transport motor when the backup plate is moved downward. This makes it possible to switch power transmission efficiently in accordance with the operation of fixing the circuit board and to protect the transport motor against vibration and shock attributable to the elevating operation of the backup plate.

A sixth aspect of the invention is directed to the circuit board fixing table characterized in that said driving side power transmission member and said driven side power transmission member are gears.

In this circuit board fixing table, since the driving side power transmission member and the driven side power transmission member are gears, linkage for power transmission can be easily established and canceled by engaging and separating those gears with and from each other, and the driving force can be efficiently and reliably transmitted through the gears.

A seventh aspect of the invention is directed to the circuit board fixing table characterized in that said driving side power transmission member and said driven side power transmission member are rollers.

In this circuit board fixing table, since the driving side power transmission member and the driven side power transmission member are rollers, they can be linked by simply pressing them against each other without taking any deviation of the rotating position of each roller into consideration.

A eighth aspect of the invention is directed to the circuit board fixing table characterized in that the power transmission mechanism includes a driven side power transmission member attached to a driving shaft for the transport belts, a driving side power transmission member driven by the transport motor for rotation so that the driving side power transmission member can be linked with the driven side power transmission member, transport belts stretched between the driven side power transmission member and the driving side power transmission member with a slack, and a tension roller for urging the transport belts to absorb the slack of the transport belts.

In this circuit board fixing table, since the driving force of the transport motor is transmitted to the transport belts through the belt and the amount of a movement of the transport belts are absorbed with tension roller which absorbs the slack of the belt, it is possible to provide the transport motor separately from the transport belts while performing power transmission.

A ninth aspect of the invention is directed to a circuit board fixing method for fixing a circuit board using a circuit board fixing table including a fixing device for fixing the circuit board, a support member of the transport belts, a transport motor provided separately from the support member of the transport belt for driving the transport belts, a power transmission mechanism for transmitting a driving force of the transport motor to the transport belts, and an elevation actuator, wherein the power transmission mechanism has a driven side power transmission member attached to a driving shaft for the transport belts, a driving side power transmission member driven by the transport motor for rotation so that the driving side power transmission member can be linked with the driven side power transmission member, wherein the driven side power transmission member and the driving side power transmission member are gears, and wherein the elevation actuator elevates the driven side power transmission member and the driving side power transmission member relatively so that the driven side power transmission member links and unlinks with the driving side power transmission member. The circuit board fixing method includes the steps of, canceling a linkage between the driving side power transmission member and the driven side power transmission member, and setting magnetizing force of the transport motor for a small value during re-establishing the linkage after canceling the linkage.

In this circuit board fixing method, since a small magnetizing force is set for the transport motor when the linkage is re-established between the driving side power transmission member and the driven side power transmission member which are constituted by gears after once canceling linkage, the teeth of those gears will be compliant to each other when engaged, which makes it possible to prevent the occurrence of noises during engagement. It is also possible to prevent friction between the teeth when they are engaged with each other. Specifically, resonance of members connected to each gear can be prevented because the driving side power transmission member makes free rotation.

A tenth aspect of the invention is directed to the circuit board fixing method characterized in that magnetization of the transport motor is stopped when the linkage between the driving side power transmission member and the driven side power transmission member is re-established after once canceling the linkage.

In this circuit board fixing method, since magnetization of the transport motor is stopped when the linkage is re-established between the driving side power transmission member and the driven side power transmission member, the teeth of those gears will engage each other with substantially no resistance, which is further effective in reducing noises during engagement and friction between the teeth during engagement.

A eleventh aspect of the invention is directed to an electronic component mounting apparatus for sequentially mounting electronic components in predetermined positions on a circuit board based on input NC information with component holding member having a suction nozzle for releasably holding the electronic components. The electronic component mounting apparatus includes a circuit board fixing table for transporting and fixing a circuit board placed on transport belts to a predetermined position having a fixing device for fixing the circuit board, a support member of the transport belts, a transport motor provided separately from the support member of the transport belts, and a power transmission mechanism for transmitting a driving force of the transport motor to the transport belts, wherein the circuit board fixing table fixes a circuit board loaded into the electronic component mounting apparatus, and wherein the electronic components are mounted by the the electronic component mounting apparatus.

In this electronic component mounting apparatus, since a circuit board transported into the electronic component mounting apparatus is fixed to perform mounting of electronic components using the circuit board fixing table, the failure rate of the electronic component mounting apparatus is reduced to improve the efficiency of mounting electronic component on a circuit board and to improve productivity.

A twelfth aspect of the invention is directed to the circuit board fixing table including guide rails having two transport belts and the support member of the transport belts, wherein the guide rails are provided in parallel to a direction of transporting the circuit board, wherein the support member of the transport belts has two first pulleys provided in the direction of transporting the circuit board, two second pulleys provided in an opposite side of the first pulleys in the direction of transporting the circuit board, wherein each of the transport belts is slung over the first pulley and the second pulley and supports the circuit board, wherein the first pulleys connected each other with a driving shaft, wherein the driving motor is provided separately from the guide rails, and wherein the power transmission member is provided with the driving shaft in order to transmit driving force of the transport motor to the transport belts.

A thirteenth aspect of the invention is directed to the circuit board fixing table, further including a control device, wherein the power transmission member has a driven side power transmission member and a driving side power transmission member, wherein the driven side power transmission member can be linked and unlinked with the driving side power transmission member, and wherein the control device controls the transport motor in a such manner that the control device sets a magnetizing power of the transport motor for a small value or stops the transport motor magnetizing when the driven side power transmission is linked with the driving side power transmission member again after the linkage is canceled.

DETAILED DESCRIPTION OF THE PREFERRED EMBODIMENTS

An embodiment of an electronic component mounting apparatus according to the invention is described with reference to the drawings.

Figure 1:
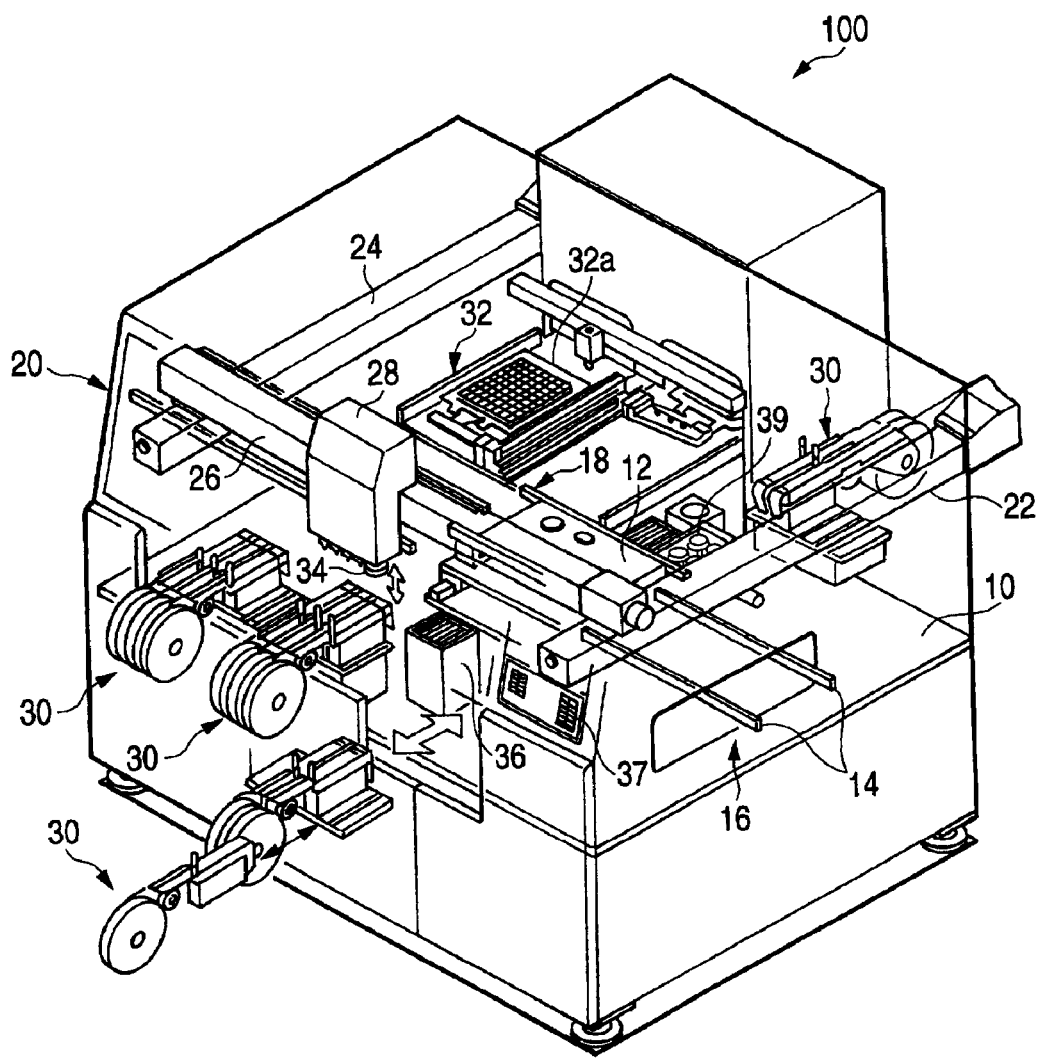
FIG. 1 is an external view of an electronic component mounting apparatus in which a moving head loaded with a mounting head moves on a circuit board to perform a mounting operation.
Figure 1:
Figure 2:
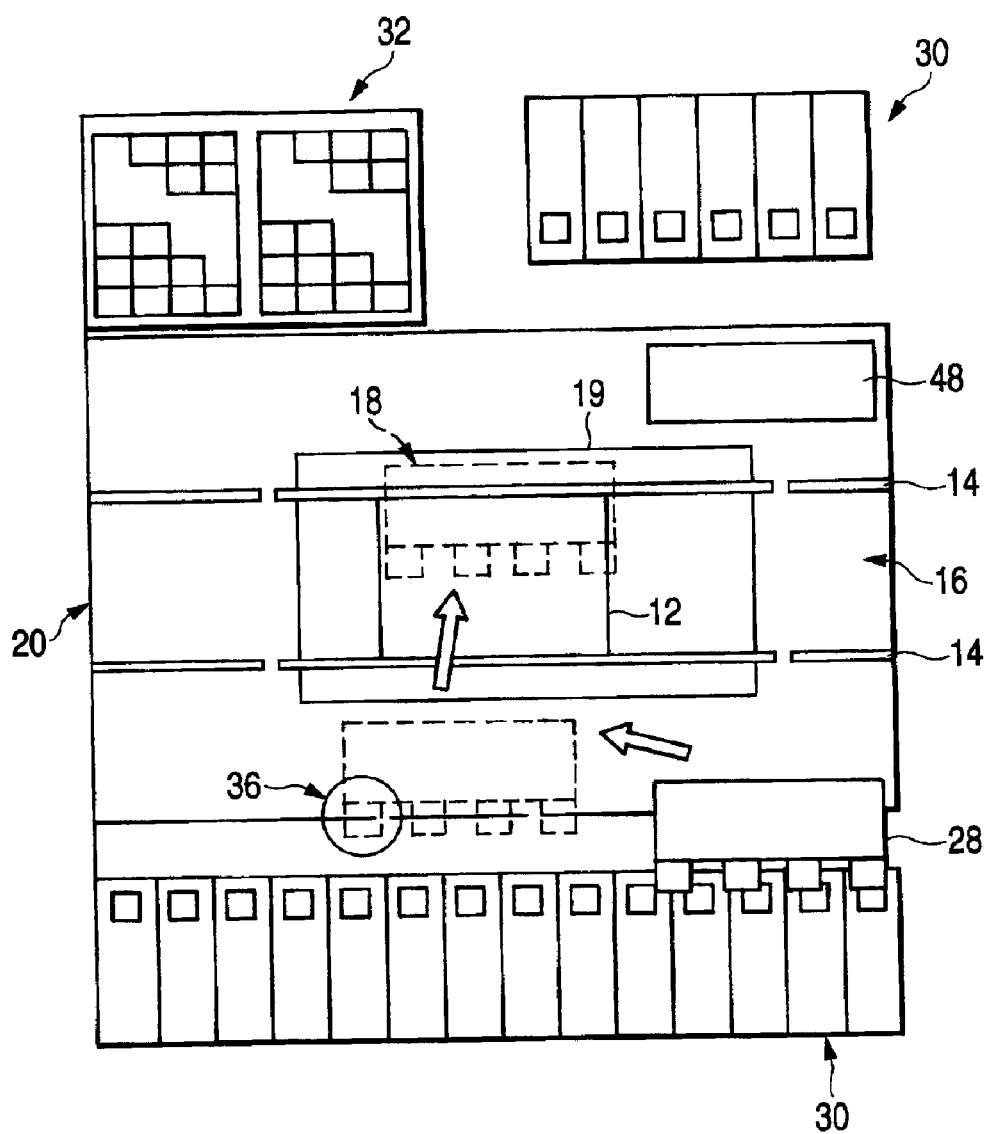
FIG. 2 is a schematic plan view for explaining an operation of the electronic component mounting apparatus.

FIG. 1 is an external view of an electronic component mounting apparatus in which a moving head loaded with a mounting head moves on a circuit board to perform a mounting operation, and FIG. 2 is a schematic plan view for explaining the operation of the electronic component mounting apparatus.

At first, a configuration of an electronic component mounting apparatus 100 of the present embodiment is described.

As shown in FIG. 1, a pair of guide rails 14 is provided in the middle of the top surface of a base plate 10 of the electronic component mounting apparatus. The guide rails 14 transports a circuit board 12 by supporting both ends of the circuit board in the direction of the width of the circuit board 12. The circuit board 12 is transported by transport belts provided on the guide rails 14 from a loader section 16 provided on one end of the rails to an electronic component mounting position 18 and from the mounting position 18 to an unloader section 20 at another end of the rails. A circuit board fixing table 19 is provided at the electronic component mounting position 18, and the circuit board 12 transported from the loader section 16 is placed and fixed on the guide rails 14 on the circuit board fixing table 19. A detailed configuration of the circuit board fixing table 19 will be described later.

Y tables 22 and 24 are provided on both sides of the top surface of the base plate 10 above the circuit board 12, and an X table 26 is suspended between the two Y tables 22 and 24. A moving head 28 is mounted on the X table 26, which makes it possible to move the moving head 28 in an X-Y plane.

The moving head 28, which is a holding member is loaded on an XY robot consisting of the X table 26 and Y tables 22 and 24 and is movable on the X-Y plane (horizontal plane). The moving head 28 sucks desired electronic components from parts feeders 30 or parts trays 32 with a suction nozzle 34 and mounts the electronic components in predetermined positions on the circuit board 12. The parts feeders 30 supply electronic components such as resistor chips and chip capacitors, and the parts trays 32 supply relatively large electronic components including ICs such as SOP(Small Outline Package)s and QFP(Quad Flat Package)s and connectors.

Moreover, a recognition device 36 is provided on a side of the circuit board 12 positioned on the guide rails 14. The recognition device 36 detects any two-dimensional positional shift (suction attitude) of an electronic component sucked by the suction nozzle 34 and corrects the positional shift at the moving head 28.

A multiplicity of the parts feeders 30 are provided in parallel on both sides of the guide rails 14 in a direction of the length of the guide rails, and a component reel shaped as a tape containing electronic components such as resistor chip and chip capacitors is established to each of the parts feeders 30.

Referring to the parts trays 32, two trays 32a on which electronic components such as QFPs are placed can be loaded in this configuration.

The moving head 28 is configured as a multiple head consisting of a plurality of (four in the present embodiment) mounting heads connected side by side. The suction nozzle 34 of each mounting head is replaceable, and the other nozzles as substitutes are contained in advance in a nozzle stocker 39 on the base plate 10 of the electronic component mounting apparatus 100.

Next, the operation of the electronic component mounting apparatus 100 having the above-described configuration is described.

As shown in FIG. 2, when a circuit board 12 is transported from the guide rails 14 at the loader section 16 onto the circuit board fixing table 19 provided in the mounting position 18, the circuit board 12 is transported to and fixed in a predetermined position on the circuit board fixing table 19. Then, the moving head 28 is moved by the XY robot in the XY plane to suck a desired electronic component from a parts feeder 30 or parts tray 32 and is moved on to an attitude recognition camera of the recognition device 36 for recognition of the suction attitude of the electronic component to perform an operation of correcting the suction attitude.

When each mounting head 38 sucks an electronic component from a parts feeder 30 or parts tray 32 with the suction nozzle 34 and when it mounts the electronic component in a predetermined position of the circuit board 12, the suction nozzle 34 is moved down in the vertical direction (Z direction) from the XY plane. The suction nozzle 34 is appropriately replaced depending on the type of the electronic component.

The operation of absorbing electronic components and the operation of mounting them on the circuit board 12 are repeated to complete the mounting of electronic components on the circuit board 12. When the mounting is completed, the circuit board 12 is transported out of the circuit board fixing table 19 to the unloader section 20, and a new circuit board is transported into the loader section 16 and the above operations are repeated on the same.

A main controller based on a preset mounting program controls such an electronic component mounting operation. The mounting program is a program obtained by rearranging a mounting sequence of NC information including information of electronic component to be mounted and converting the data thus generated into commands for driving the above-described XY robot, the absorption nozzles 34 of the moving head 28 and so on. Executing the mounting program performs the mounting of electronic component on a circuit board 12. Data such as programs for mounting can be directly input to the main controller from an operation panel 37.

A structure and operation of the circuit board fixing table 19 characteristic of the present invention is described in detail.

Figure 3:
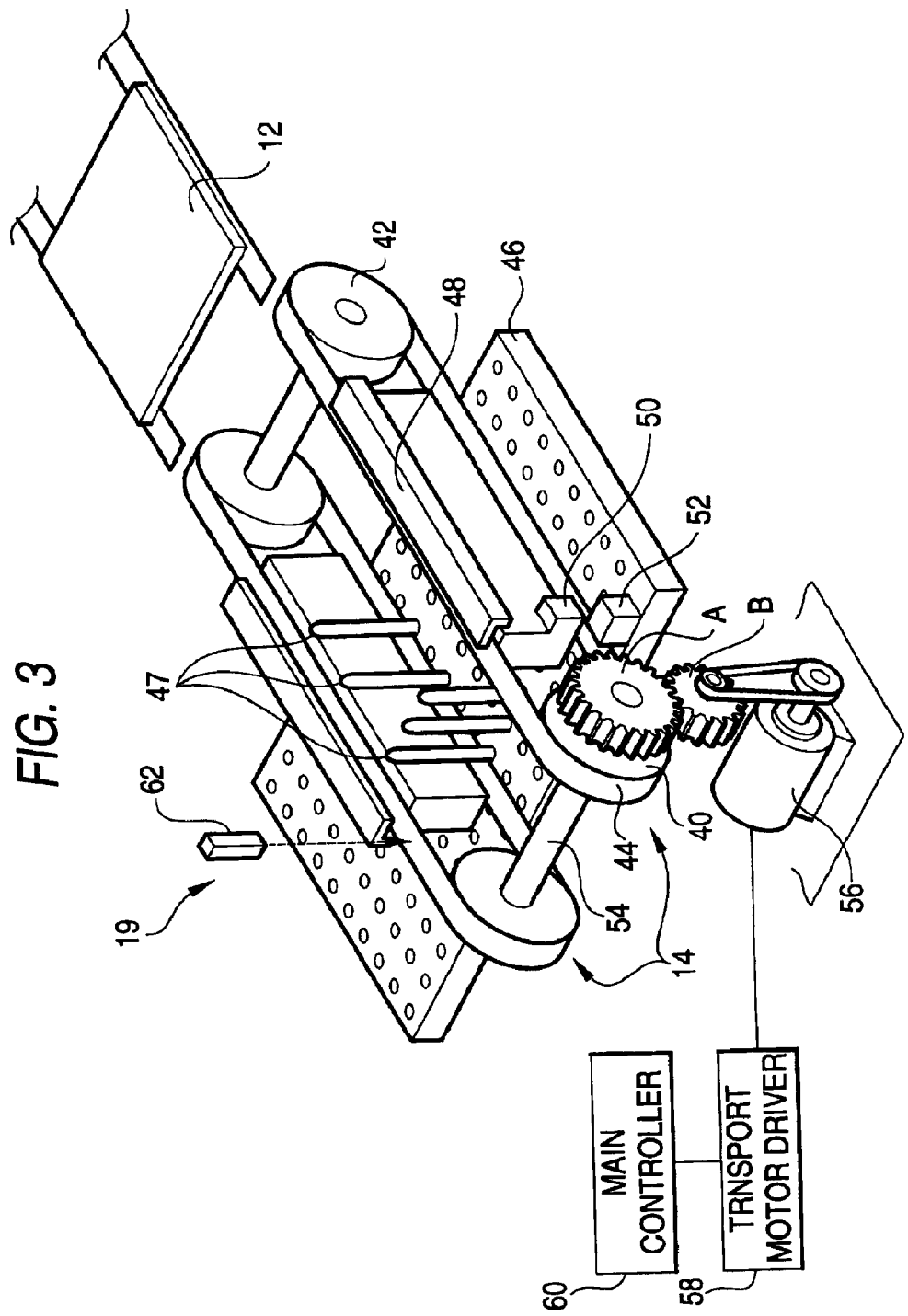
FIG. 3 is a perspective view showing a conceptual configuration of a circuit board fixing table.

FIG. 3 is a perspective view of the circuit board fixing table 19 showing a conceptual configuration of the same. In the circuit board fixing table 19, two rows of guide rails 14 consisting of pair of pulleys 40 and 42 provided on both ends of the circuit board fixing table 19 in the transport direction thereof and a transport belt 44 stretched between the pulleys 40 and 42 for supporting a circuit board 12 are provided in the board transport direction of the circuit board fixing table 19. Under the guide rails 14, a backup plate 46 for pushing up the circuit board 12 is provided such that it can be elevated. A board fixing plate 48 is fixed above the guide rails 14 separately from the guide rails 14 with a predetermined gap (which is at least as large as the thickness of the circuit board 12) provided between the transport belts and the board fixing plate 48. Further, the backup plate 46 has a projection 52, which abuts an abutting portion 50 provided on the guide rails 14 to move up the guide rails 14 when the plate moves upward.

A gear A (driven side power transmission member) as a power transmission mechanism is attached to a support member of the transport belts including driving shaft of the pulley 40 and the pulley 40 provided in the guide rails 14, and a gear B (driving side power transmission member) is attached to a transport motor 56 provided separately from the guide rails 14 such that it can couple and decouple power to the gear A. The transport motor 56 is connected to a transport motor driver 58, and magnetization and rotation of the motor is controlled based on commands from a main controller 60. A board sensor 62 is provided above the guide rails 14 to set a position where the circuit board 12 is to be fixed.

A multiplicity of pin insertion holes are drilled on the top surface of the backup plate 46 in the form of a matrix to allow a multiplicity of backup pins 47 to be attached and removed. Backup pins 47 are inserted into pin insertion holes selected according to a pattern for mounting electronic components on the circuit board 12, and the upper ends of the backup pins 47 push up the circuit board from below. This makes it possible to prevent the problem of unstable mounting that is caused by downward escape of the circuit board 12 attributable to a force applied thereto from above during mounting of electronic components.

Therefore, the circuit board fixing table 19 has a structure in which the guide rails 14 can be elevated in a section from the position where the projection 52 on the backup plate 46 abuts the abutting portion 50 to the position where the circuit board 12 abuts the bottom surface of the board fixing plate 48, and the backup plate 46 and the board fixing plate 48 serve as a fixing device for fixing the circuit board 12.

Figure 4:
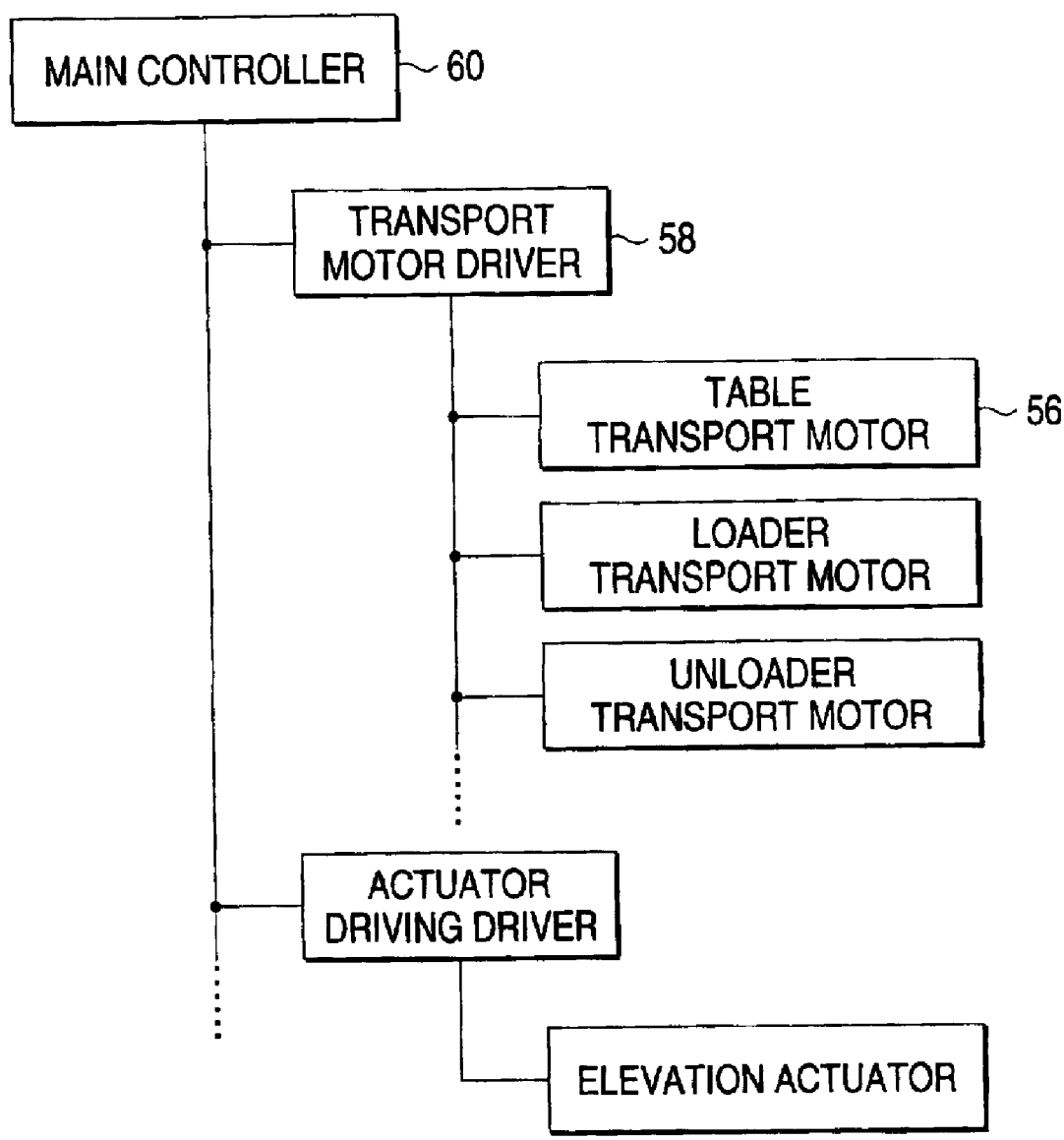
FIG. 4 is a block diagram of control over the circuit board fixing table performed by a main controller.

FIG. 4 is a block diagram showing control over the circuit board fixing table 19 performed by the main controller 60. As shown in the same figure, the transport motor 56 for the table, a loader transport motor for the guide rails at the loader section 16, an unloader transport motor at the unloader section 20, and so on are controlled by the main controller 60 through a transport motor driver 58, and an elevation actuator such as an air cylinder for elevating the backup plate 46 is controlled by the main controller 60 through an actuator driving driver.

Figure 5:
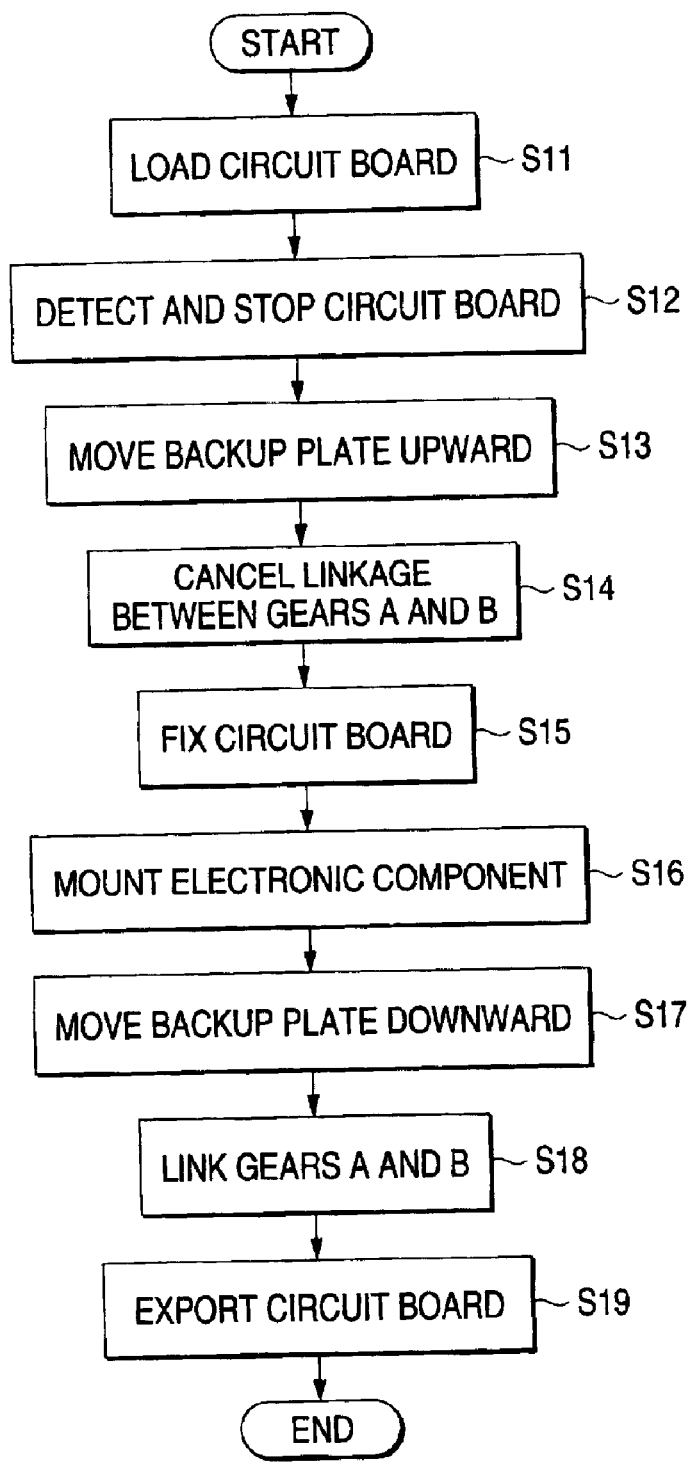
FIG. 5 is a flow chart showing an operation of the circuit board fixing table.
Figure 6:
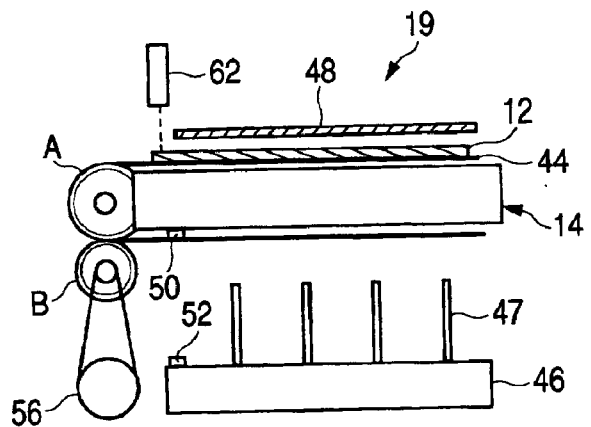
FIG. 6 is an illustration showing operations of transporting a circuit board in and out the circuit board fixing table and fixing the same step by step.
Figure 6:
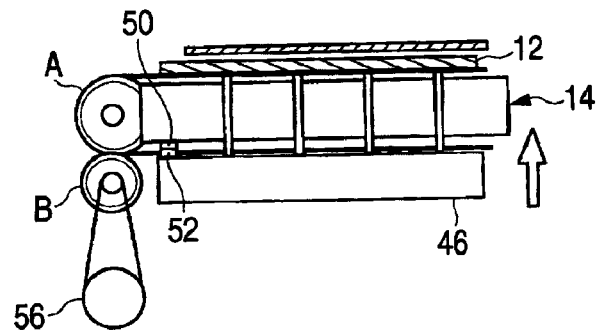
Figure 6:
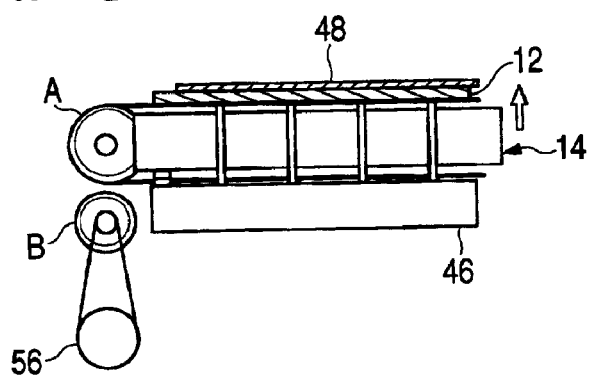
Figure 6:
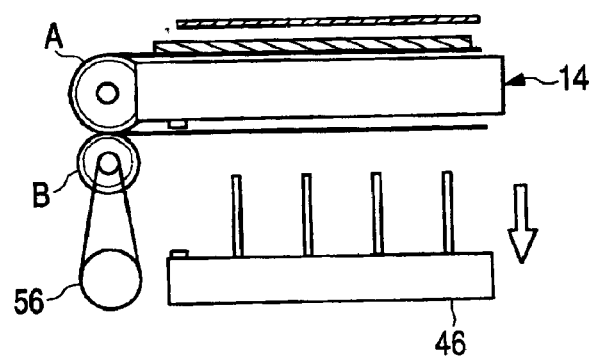

The operation of the circuit board fixing table is described using FIG. 6 based on the flow chart in FIG. 5. FIG. 6 illustrate operations of the circuit board fixing table for transporting a circuit board in and out and fixing the same step by step.

First, as shown in FIG. 6(a), a circuit board 12 placed on the transport belt 44 is transported to the left in the figure by driving the transport motor 56 and transmitting the power between the gears A and B to rotate the pulley 40 (step 11 which is hereinafter abbreviated to read "S11"). When the board sensor 62 detects the circuit board 12, the main controller 60 stops the driving of the transport motor 56 to stop the transportation of the circuit board 12 (S12). Then, as shown in FIG. 6(b), the backup plate 46 is moved upward by driving the elevation actuator (not shown) (S13) to cause the projection 52 on the backup plate 46 to abut the abutting portion 50 of the guide rails 14. When he backup plate 46 is moved upward along with the guide rail 14 with the projection 52 in contact with the abutting portion 50 as shown in FIG. 6(c), the gear A for power transmission on the guide rails 14 and the gear B on the transport motor are separated from each other to cancel the linkage between the gears A and B (S14) Further, the top surface of the circuit board 12 is urged against the bottom surface of the board fixing plate 48 to fix the circuit board 12 on the circuit board fixing table 19 (S15).

The operation of mounting electronic components is performed in the fixed state (S16) When the mounting operation is completed, the backup plate 46 is moved downward as shown in FIG. 6(d) (S17). As a result, the guide rails 14 are lowered to a position where the gear A engages the gear B to re-establish linkage between the gears A and B (S18). Thereafter, the backup plate 46 is lowered to and stopped at a standby position, and the transport belt 44 is driven to transport the circuit board 12 out of the apparatus (S19).

As thus described, the backup plate 46 is always elevated when switching occurs between transportation of a circuit board 12 and mounting of electronic components, and the circuit board fixing table of the present embodiment is configured such that no vibration or shock is propagated to the transport motor 56 as a result of the elevating operation. Specifically, the gears A and B for power transmission can be set to transmit or not to transmit the driving force of the transport motor 56, and the transport motor 56 is fixed separately from the guide rails 14. That is, linkage is established and canceled between the gears A and B in conjunction with the elevating operation of the backup plate 46 that is required for fixing and releasing the circuit board 12, which allows the power to be transmitted only when the circuit board 12 is to be transported. Thus, power transmission can be efficiently switched with a single elevation actuator to provide an apparatus with a simple configuration, and the transport motor 56 can be protected from vibration and shock attributable to the elevating operation of the backup table 46 to prevent occurrence of damage and malfunction of the transport motor 56. Further, the use of gears as power transmission members makes it possible to transmit the driving force of the transport motor 56 to the transport belt efficiently and reliably.

Moreover, since the transport motor 56 is separated from the guide rails 14 that are movable parts, it is not necessary to treat a power cable to be connected to the transport motor 56 as a movable cable when it is routed, which allows the cable to be laid easily and prevents breakage of the cable. Since the linkage between the transport motor 56 and the transport belt 44 is canceled when no transportation is required, the guide rails 14 can be moved freely, which improves flexibility in designing the circuit board fixing table 19.

Further, since it is not necessary to provide the transport motor at the ends of the guide rails 14 unlike the prior art, the guide rails 14 themselves are freed from an eccentrically loaded state, which improves the load balance to allow the guide rails 14 to be elevated more smoothly. The reduction of the weight of the guide rails 14 results in a reduction of loads originating from the weight of the same, which is advantageous in that wear of each part of the mechanism can be reduced.

By configuring the electronic component mounting apparatus 100 for sequentially mounting electronic components in predetermined positions on a circuit board based on input NC information with component holding means having an absorption nozzle for removably holding the electronic components using such a circuit board fixing table, it is possible to reduce the failure rate of the electronic component mounting apparatus 100, to improve the efficiency of mounting of electronic components on a circuit board 12, and to improve productivity.

A second embodiment of an electronic component mounting apparatus according to the invention will now be described.

A circuit board fixing table of the electronic component mounting apparatus of the present embodiment has the same mechanism as that shown in the first embodiment except that the gear A is linked with gear B more smoothly.

The operation of the circuit board fixing table of the present embodiment will now be described using FIG. 8 based on the flow chart in FIG. 7. FIG. 8 illustrate how the gears A and B are re-linked after the linkage between them is once canceled.

Figure 7:
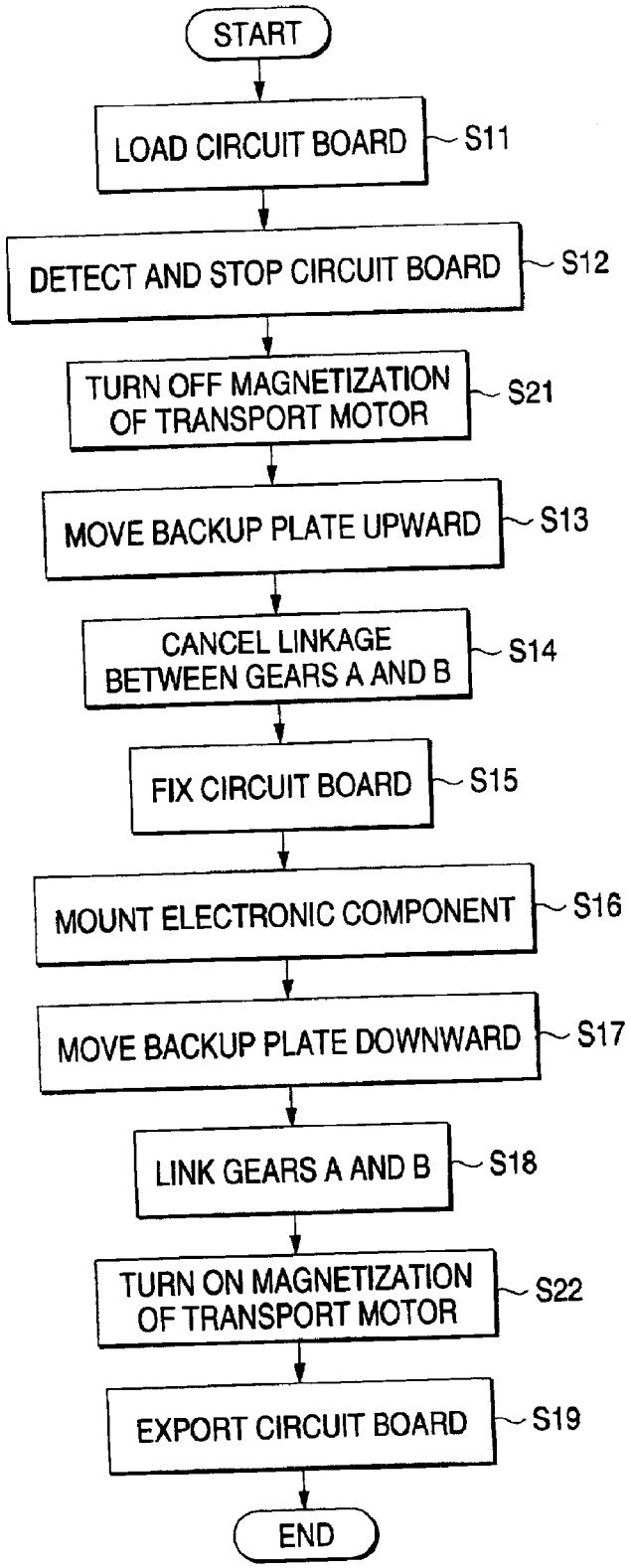
FIG. 7 is a flow chart showing an operation of a circuit board fixing table according to a second embodiment of the invention.
Figure 8:
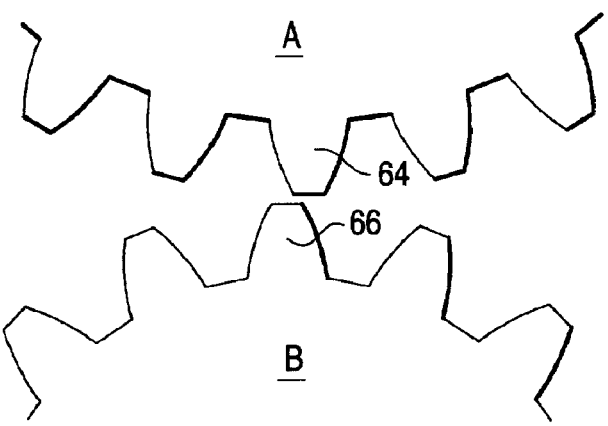
FIG. 8 is an illustration how gears A and B are re-linked after the linkage between them is once canceled.
Figure 8:
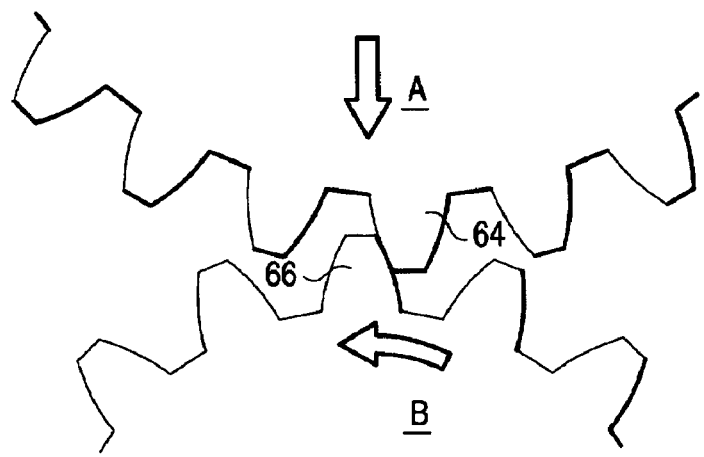
Figure 8:
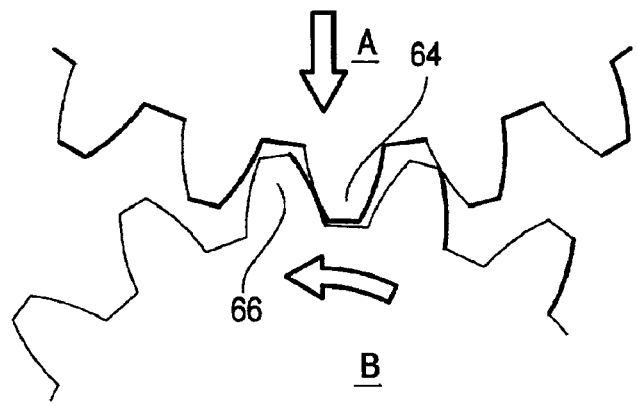

Steps shown in FIG. 7 that are identical to those in the above-described first embodiment are indicated by like reference numbers to omit the description of them.

The circuit board fixing table of the present embodiment has additional operations, i.e., a step of turning the magnetization of the transport motor 56 off to stop the same before elevating the backup plate 46 after a circuit board 12 stops in the mounting position 18 (S21) and a step of turning the magnetization of the transport motor 56 on before unloading the circuit board after the backup plate 46 is lowered and the gears A and B are re-linked (S22).

When the magnetization of the transportation motor 56 is stopped, the gear B connected to the transport motor 56 enters a free rotating state. As a result, as shown in FIG. 8(a), even when the angular position of the rotation of each of the gears A and B changes after linkage between the gears A and B is canceled, the gears will smoothly engage each other. Specifically, as the gear A approaches the gear B as shown in FIG. 8(b), a tooth 64 of the gear A in a fixed angular position of rotation urges a tooth 65 of the gear B in the free state in the circumferential direction to cause the gear B rotate slightly. As a result, the teeth of those gears with engage each other with increasing compliance to each other, which makes it possible to suppress noises during engagement. Friction between the teeth during engagement or, more specifically, resonance of members coupled to each of the gears can be also prevented because the gear B is in free rotation.

While a deviation of the rotational position of the gear B that occurs as a result of the engagement of the gears A and B is input to the main controller 60, the main controller 60 cuts off the deviation of the rotational position to prevent the transport motor 56 from operating so as to restore the deviation when it causes magnetization of the transport motor 56 again. As a result, the main controller 60 judges that the transport belt 44 of the circuit fixing table 19 is in the same position where it was located before the cancellation of the linkage between the gears A and B, which makes it possible to control transportation without causing any positional shift.

The same effect can be achieved by setting a lower magnetizing force instead of stepping the magnetization of the transport motor 56 as described above as a modification of the present embodiment. In this case, the occurrence of play of the apparatus can be prevented for improved safety because it is possible to prevent the occurrence of a deviation of the rotational position of the gear B more preferably compared to the method of control in which magnetization is completely stopped.

Figure 9:
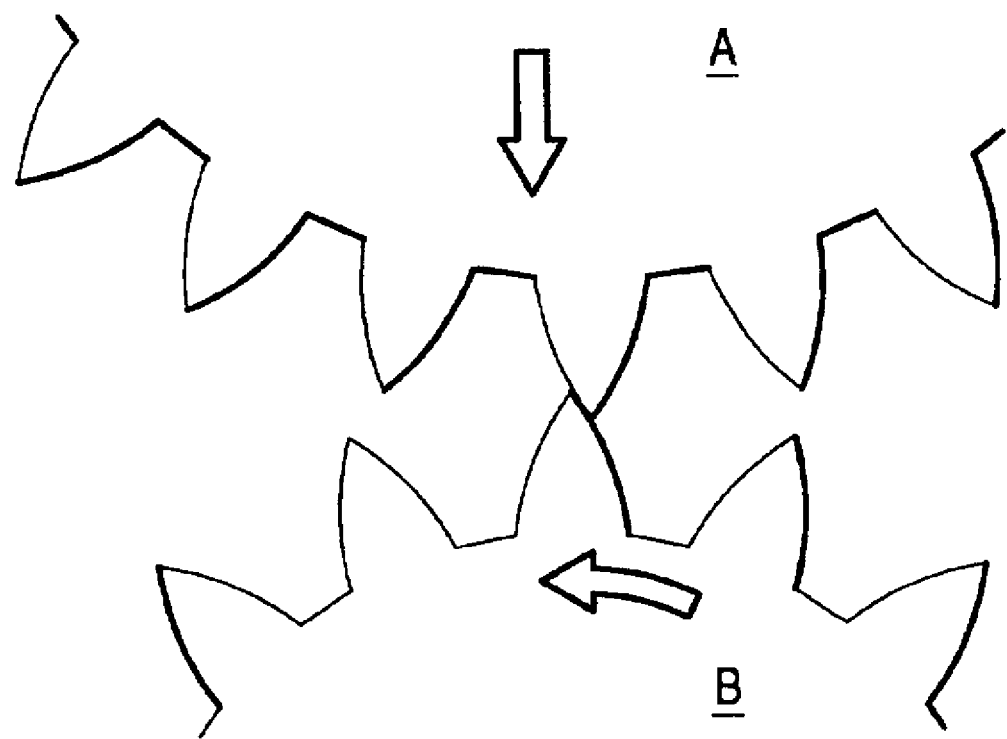
FIG. 9 is a view of gears A and B having a cycloid tooth configuration.

For example, the teeth of the gears A and B may have a cycloid tooth configuration as shown in FIG. 9 or a simple triangular tooth configuration instead of a common involute tooth configuration. By adopting a tooth configuration having an acute angle, interference between teeth during engagement is reduced, which allows a further reduction of problems associated with engagement such as noises and resonance.

A third embodiment of an electronic component mounting apparatus of the invention is described.

A circuit board fixing table of the electronic component mounting apparatus according to the present embodiment employs a roller type linkage mechanism in the region where power is coupled between the gears A and B shown in the first embodiment.

Figure 10:
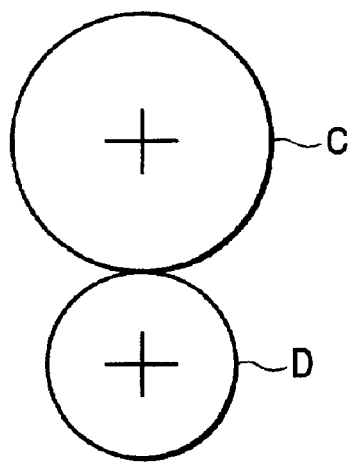
FIG. 10 illustrates a conceptual configuration of a power coupling section according to a third embodiment of the invention.
Figure 10:
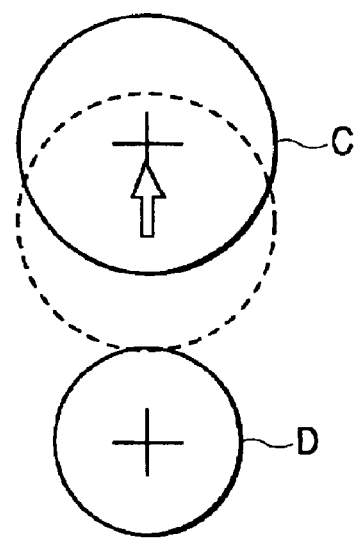

FIG. 10 illustrate an example of a power coupling section configured using rollers.

Specifically, there is provided in which a roller C provided on the guide rails 14 is put in contact with a roller D provided on the transport motor 56 when power is transmitted as shown in FIG. 10(a) and in which the rollers C and D are separated from each other during mounting as shown in FIG. 10(b). This configuration makes it possible to separate the transport motor 56 from the guide rails 14 with a simple configuration without taking any deviation of the rotational position of the roller D into consideration. Providing a rubber material on the outer circumferential surface thereof, for example, preferably provides an anti-slip treatment on each of the rollers C and D.

Figure 11:
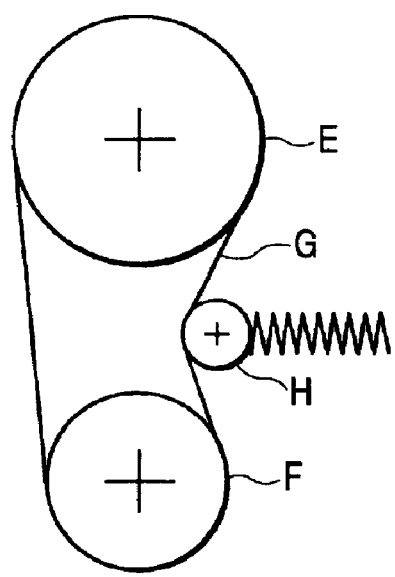
FIG. 11 illustrates an example of a power coupling section configured using a belt.
Figure 11:
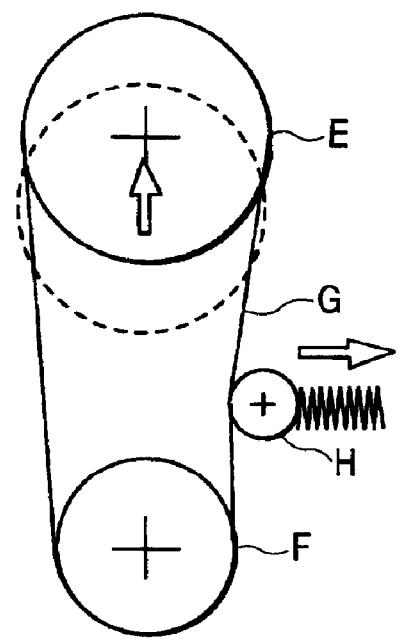

A belt type linkage mechanism may be employed instead of the roller type linkage mechanism of the present embodiment. FIG. 11(a) shows a state of the power coupling section of the circuit board fixing table 19 during transportation of a board with the above-described backup plate 46 in the standby position, and FIG. 11(b) shows a state of the power coupling section during mounting of electronic components after elevation of the backup plate 46.

In the above-described configuration, as shown in FIG. 11(a), a timing belt G is stretched between a pulley E provided on the guide rails 14 and a pulley F provided on the transport motor 56 with a slack, and a tension roller H is provided between the pulley E and pulley F to urge the timing belt G inward. Therefore, at the time of power transmission as shown in FIG. 11(a), the slack of the timing belt G is absorbed by urging the same with the tension roller H, and the contact angle of the timing belt G is increased to transmit power. During mounting as shown in FIG. 10(b), an increase in the distance between the shafts of the pulleys E and F is absorbed by a movement of the tension roller.

The above-described configuration makes it possible to separate the transport motor 56 from the guide rails 14 with a simple structure without considering any deviation of the rotational position of the gears attributable to engagement of the same. It is therefore possible to prevent vibration and shock attributable to the elevation of the backup plate 46 from being propagated to the transport motor 56. While the use of the timing belt G makes it possible to control the transport position with improved accuracy by preventing the occurrence of a slip, other belts such as V-belts and flat belts may be used.

While the above-described embodiments have referred to circuit board fixing tables for an electronic component mounting apparatus 100 as examples, the circuit board fixing table of the present invention is not limited to them, and the invention may be applied to circuit board fixing table in general including those for circuit board manufacturing apparatuses such as cream solder printing apparatuses and bond applying apparatuses.

An example of a specific configuration of a circuit board fixing table 19 according to the above-described first embodiment is described.

Figure 12:
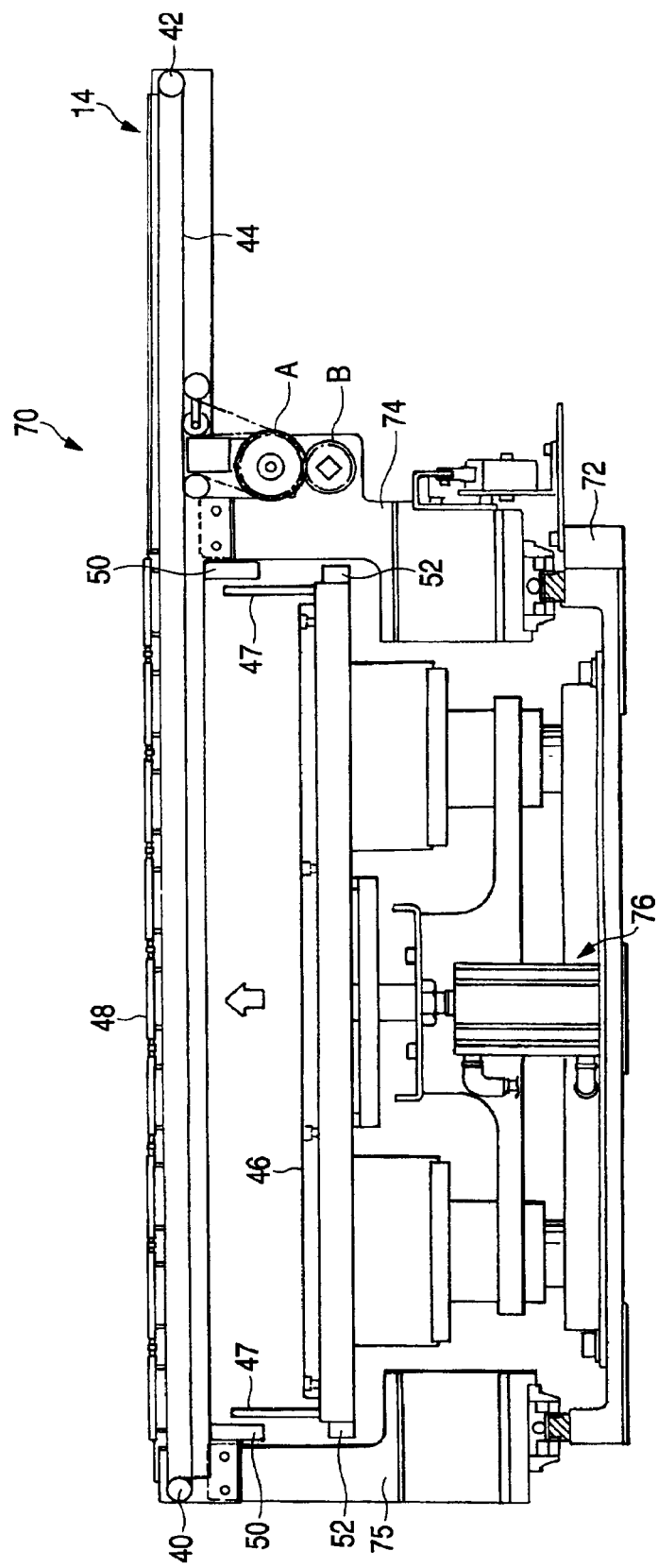
FIG. 12 illustrates a configuration of a circuit board fixing table during transportation of a circuit board.
Figure 13:
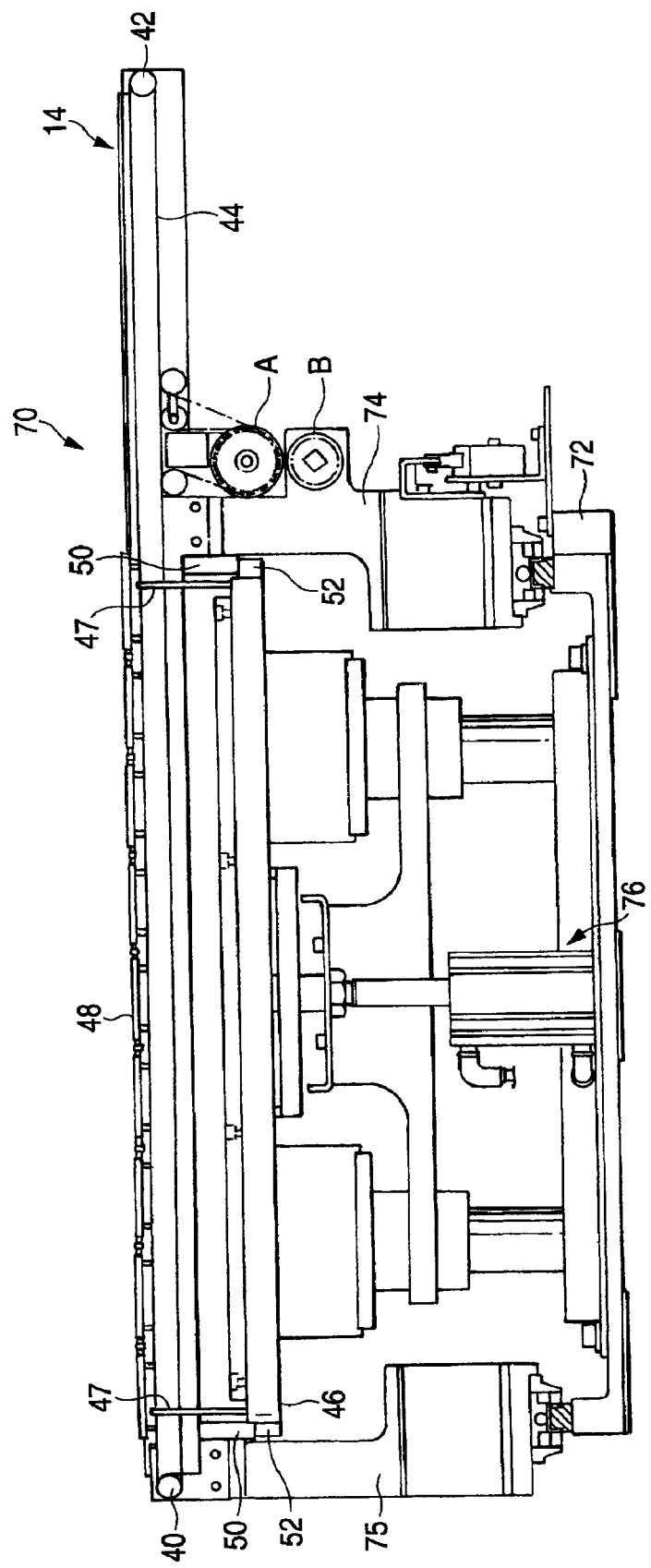
FIG. 13 illustrates a configuration of the circuit board fixing table during mounting of electronic components.
Figure 14:
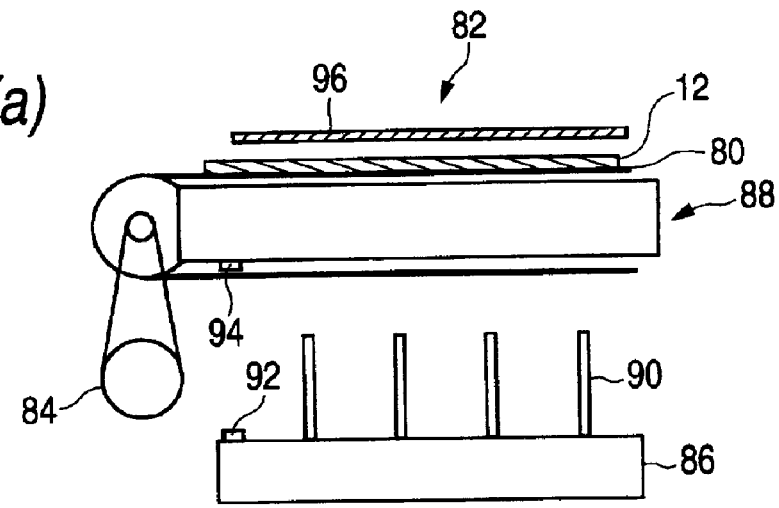
FIG. 14 is a side view of a conventional circuit board fixing table showing a configuration and operation of the same.
Figure 14:
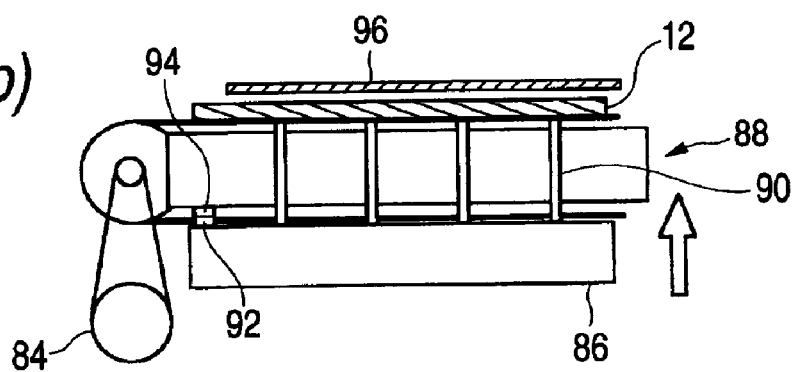
Figure 14:
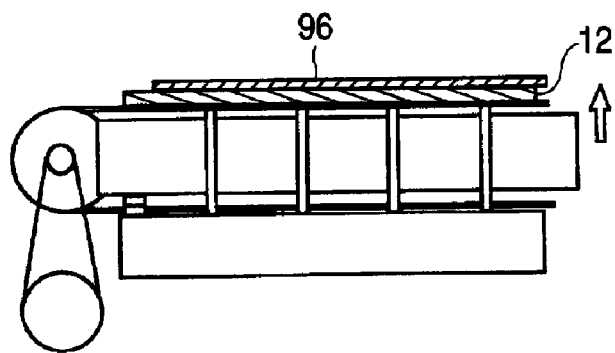
Figure 15:
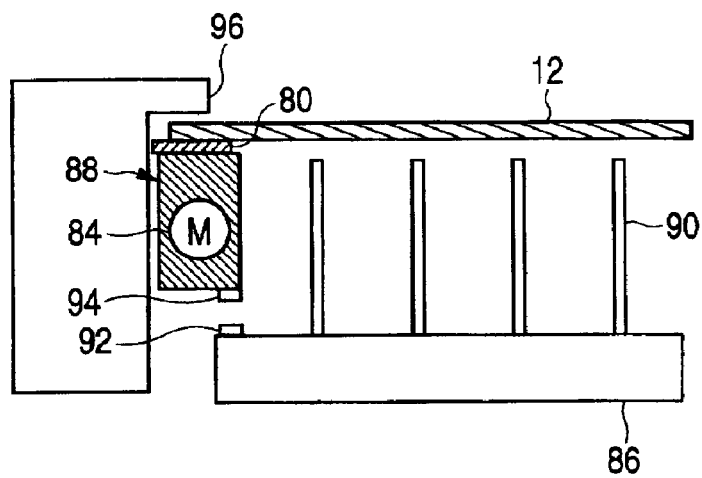
FIG. 15 shows a vertical section of a conventional transport table in the transport direction thereof.
Figure 15:
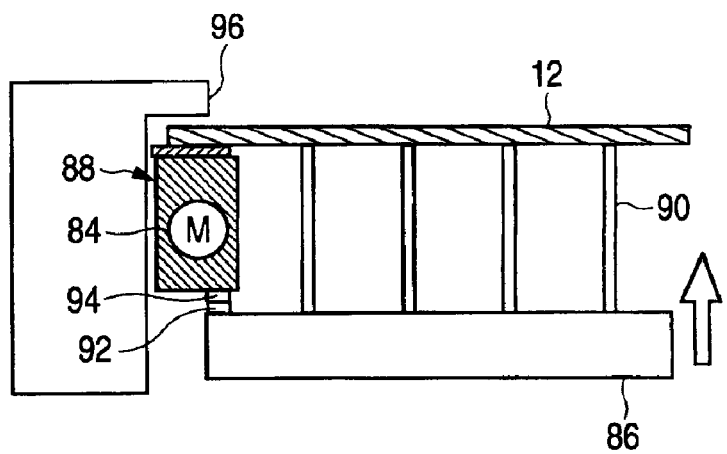
Figure 15:
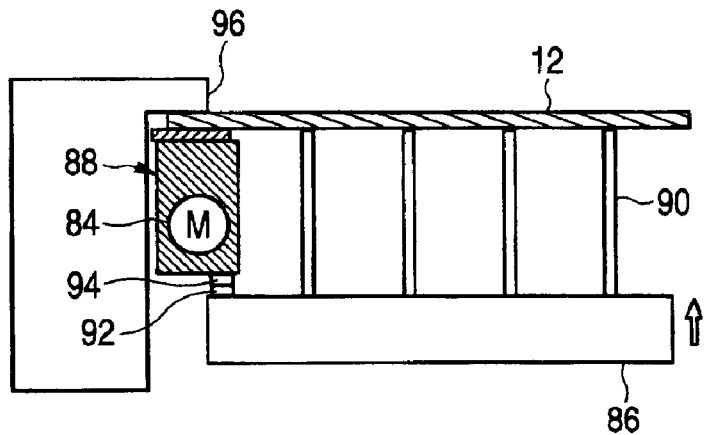

FIGS. 12 and 13 show a configuration of a circuit board fixing table 70, FIG. 12 showing the configuration during transportation of a circuit board, FIG. 13 showing the configuration during mounting of electronic components. Members having the same functions as those of the members shown in the first embodiments are indicated by like reference numbers.

As shown in FIG. 12, in the circuit board fixing table 70, guide rails 14 comprised of a pair of pulleys 40 and 42 provided on both sides of the circuit board fixing table 70 in the transport direction and a transport belt 44 stretched between the pulleys 40 and 42 for supporting a circuit board 12 is provided in the board transport direction of the circuit board fixing table 19. The transport belt 44 is pulled out downward in the figure in the middle of the transport path of the guide rail 14 and is wound around a shaft attached to a gear A for power transmission. A gear B for power transmission that engages the gear A is pivoted by a support body 74 provided on a base 72 and is connected to a transport motor which is fixed to the support body 74 and which is not shown.

Under the guide rail 14, a backup plate 46 for supporting the circuit board 12 from below is provided such that it can be elevated by an elevation actuator 76 that is constituted by an air cylinder. Above the guide rail 14, a board fixing plate 48 is fixed by the support bodies 74 and 75 at a predetermined interval from the transport 44, and a projection 52 is provided on a backup plate 46, the projection 52 abutting an abutting portion 50 provided on the guide rail 14 to move the guide rail 14 upward when it is moved upward. The guide rail 14 is supported such that it can be elevated relative to the support bodies 74 and 75.

When the backup plate 46 is moved upward by driving the elevation actuator 76 as shown in FIG. 13, the projection 52 on the backup plate 46 pushes the abutting portion 50 of the guide rail 14 upward to move the guide rail 14 upward. This cancels the linkage between the gears A and B.

In this configuration, any vibration or shock as a result of the elevation of the backup plate 46 is propagated to the transport motor fixed to the support body 74, which makes it possible to prevent the occurrence of damage and operational defects of the transport motor.

A circuit board fixing table according to the invention is a circuit board fixing table for transporting a circuit board placed on a transport belt to a predetermined position and fixing the same with an elevating fixing device, which has a transport motor provided separately from a support member for the transport belt for driving the transport belt and a power transmission mechanism for transmitting a driving force of the transport motor to the transport belt. This makes it possible to provide a structure which prevents any vibration or shock from being applied to the transport motor during the movement of the support body in order not to apply any vibration or shock to the transport motor when a circuit board is fixed. It is therefore possible to prevent the occurrence of damage and operational defects of the transport motor.

With an electronic component mounting apparatus according to the invention, a circuit board transported into the electronic component mounting apparatus is fixed using a circuit board fixing table as described above to allow electronic components to be mounted on the same. This makes it possible to reduce the rate of failures of the electronic components mounting apparatus such as failures during the transporting operation, thereby improving the efficiency of mounting of electronic components and productivity.

What is claimed is:

1. A circuit board fixing table for transporting and fixing a circuit board placed on transport belts to a predetermined position, said circuit board fixing table comprising:
   a fixing device for fixing said circuit board;
   a support member of said transport belts;
   a transport motor provided separately from said support member of said transport belt for driving said transport belt; and
   a power transmission mechanism for transmitting a driving force of said transport motor to said transport belt,
   wherein said power transmission mechanism mechanically links said transport motor with said transport belt when said circuit board is transported, and unlinks said transport motor with said transport belt when said circuit board is not transported.

2. A circuit board fixing table for transporting and fixing a circuit board placed on transport belts to a predetermined position, said circuit board fixing table comprising:
   a fixing device for fixing said circuit board;
   a support member of said transport belts;
   a transport motor provided separately from said support member of said transport belt for driving said transport belt;
   a power transmission mechanism for transmitting a driving force of said transport motor to said transport belt; and
   an elevation actuator,
   wherein said power transmission mechanism includes:
   a driven side power transmission member attached to a driving shaft for said transport belts; and
   a driving side power transmission member attached to a shaft that is driven by said transport motor for rotation and provided such that said driving side power transmission member can be linked with said driven side power transmission member, and
   wherein said elevation actuator elevates said driven side power transmission member and said driving side power transmission member relatively so that said driven side power transmission member links and unlinks with said driving side power transmission member.

3. A circuit board fixing table for transporting and fixing a circuit board placed on transport belts to a predetermined position, said circuit board fixing table comprising:
   a fixing device for fixing said circuit board;
   a support member of said transport belts;
   a transport motor provided separately from said support member of said transport belt for driving said transport belt; and
   a power transmission mechanism for transmitting a driving force of said transport motor to said transport belt,
   wherein said power transmission mechanism includes:
   a driven side power transmission member attached to a driving shaft for said transport belt; and
   a driving side power transmission member attached to a shaft that is driven by said transport motor for rotation and provided such that said driving side power transmission member can be linked with said driven side power transmission member, and
   wherein said fixing devise elevates said transport belts so that said driven side power transmission member links and unlinks with said driving side power transmission member.

4. The circuit board fixing table according to claim 2, wherein said elevation actuator elevates a backup plate provided under said transport belts, and
   wherein said backup plate includes a plurality of backup pins and pushes up and fixes said circuit board by said back up pins when said backup plate ascends.

5. The circuit board fixing table according to claim 2, wherein said driving side power transmission member and said driven side power transmission member are gears.

6. The circuit board fixing table according to claim 2, wherein said driving side power transmission member and said driven side power transmission member are rollers.

7. A circuit board fixing table for transporting and fixing a circuit board placed on transport belts to a predetermined position, said circuit board fixing table comprising:
   a fixing device for fixing said circuit board;
   a support member of said transport belts;
   a transport motor provided separately from said support member of said transport belt for driving said transport belt; and
   a power transmission mechanism for transmitting a driving force of said transport motor to said transport belt,
   wherein said power transmission mechanism comprises:
   a driven side power transmission member attached to a driving shaft for said transport belt;
   a driving side power transmission member driven by said transport motor for rotation so that said driving side power transmission member can be linked with said driven side power transmission member;

a transport belt stretched between said driven side power transmission member and said driving side power transmission member with a slack; and a tension roller for urging said transport belt to absorb the slack of said transport belt.

8. A circuit board fixing method for fixing a circuit board using a circuit board fixing table comprising a fixing device for fixing said circuit board, a support member of said transport belt including guide rails having a driving shaft and a plurality of pulleys, a transport motor provided separately from said support member of said transport belt for driving said transport belt, a power transmission mechanism for transmitting a driving force of said transport motor to said transport belt, and an elevation actuator, wherein said power transmission mechanism includes a driven side power transmission member attached to a driving shaft for said transport belt, a driving side power transmission member driven by said transport motor for rotation so that said driving side power transmission member can be linked with said driven side power transmission member, wherein said driven side power transmission member and said driving side power transmission member are gears, and wherein said elevation actuator elevates said driven side power transmission member and said driving side power transmission member relatively so that said driven side power transmission member links and unlinks with said driving side power transmission member, said circuit board fixing method comprising the steps of:

canceling a linkage between said driving side power transmission member and said driven side power transmission member, and setting magnetizing force of said transport motor for a small value during re-establishing said linkage after canceling said linkage.

9. A circuit board fixing method according to claim 8, comprising the step of:

stopping said transport motor during re-establishing said linkage between said driving side power transmission member and said driven side power transmission member after once canceling said linkage.

10. A circuit board fixing table for transporting and fixing a circuit board placed on transport belts to a predetermined position, said circuit board fixing table comprising:

a fixing device for fixing said circuit board;

a support member of said transport belts;

a transport motor provided separately from said support member of said transport belt for driving said transport belt;

a power transmission mechanism for transmitting a driving force of said transport motor to said transport belt; and guide rails including two transport belts and said support member of said transport belts, wherein said guide rails are provided in parallel to a direction of transporting said circuit board, wherein said support member of said transport belts includes two first pulleys provided in the direction of transporting said circuit board, two second pulleys provided in an opposite side of said first pulleys in the direction of transporting said circuit board, wherein each of said transport belts is slung over said first pulley and said second pulley and supports said circuit board, wherein said first pulleys connected each other with a driving shaft, wherein said driving motor is provided separately from said guide rails, and wherein said power transmission member is provided with said driving shaft in order to transmit driving force of said transport motor to said transport belts.

11. The circuit board fixing table to according to claim 10, further comprising a control device, wherein said power transmission member includes a driven side power transmission member and a driving side power transmission member, wherein said driven side power transmission member can be linked and unlinked with said driving side power transmission member, and wherein said control device controls said transport motor in a such manner that said control device sets a magnetizing power of said transport motor for a small value or stops said transport motor magnetizing when said driven side power transmission member is linked with said driving side power transmission member again after the linkage is canceled.

* * * * *

UNITED STATES PATENT AND TRADEMARK OFFICE
CERTIFICATE OF CORRECTION

PATENT NO. : 6,945,381 B2
DATED : September 20, 2005
INVENTOR(S) : Miura et al.

It is certified that error appears in the above-identified patent and that said Letters Patent is hereby corrected as shown below:

<u>Column 3,</u>
Line 16, delete "forth" and insert -- fourth --.

<u>Column 14,</u>
Line 35, delete "devise" and insert -- device --.

Signed and Sealed this

Twenty-eighth Day of March, 2006

JON W. DUDAS
*Director of the United States Patent and Trademark Office*